(12) United States Patent
Blednov et al.

(10) Patent No.: US 9,401,682 B2
(45) Date of Patent: Jul. 26, 2016

(54) STRUCTURE FOR A RADIO FREQUENCY POWER AMPLIFIER MODULE WITHIN A RADIO FREQUENCY POWER AMPLIFIER PACKAGE

(71) Applicants: Igor Ivanovich Blednov, Toulouse (FR); Jeffrey K. Jones, Chandler, AZ (US); Youri Volokhine, Stevensbeek (NL)

(72) Inventors: Igor Ivanovich Blednov, Toulouse (FR); Jeffrey K. Jones, Chandler, AZ (US); Youri Volokhine, Stevensbeek (NL)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/489,868

(22) Filed: Sep. 18, 2014

(65) Prior Publication Data

US 2015/0303881 A1    Oct. 22, 2015

(30) Foreign Application Priority Data

Apr. 17, 2014   (WO) ................ PCT/IB2014/000807

(51) Int. Cl.
*H01L 23/10* (2006.01)
*H03F 3/195* (2006.01)
(Continued)

(52) U.S. Cl.
CPC ............... *H03F 3/195* (2013.01); *H01L 23/66* (2013.01); *H03F 1/086* (2013.01); *H03F 1/301* (2013.01); *H03F 3/213* (2013.01); *H03F 3/245* (2013.01); *H01L 2224/48091* (2013.01); *H01L 2224/48227* (2013.01); *H01L 2224/49175* (2013.01); *H01L 2224/73265* (2013.01);
(Continued)

(58) Field of Classification Search
CPC ..... H03F 1/083; H03F 1/30; H03F 2200/447; H03F 2200/451; H03F 3/195; H03F 3/213; H03F 1/086; H03F 1/301; H01L 2224/48091; H01L 2924/00014; H01L 23/66; H01L 2023/4043; H01L 2023/4062; H01L 2224/48227; H01L 2224/49175; H01L 2224/73265; H01L 23/4006; H01L 2924/19107

USPC ......................................................... 257/706
See application file for complete search history.

(56) References Cited

U.S. PATENT DOCUMENTS 3,628,105 A      12/1971   Sakai et al.
4,168,507 A  *   9/1979   Yester, Jr. ........... H01L 23/5383
                                                       257/531

(Continued)

OTHER PUBLICATIONS

Rao, Y. et al., "Ultra high dielectric constant epoxy silver composite for embedded capacitor application," Proceedings of the 52nd Electronic Components and Technology Conference; Jan. 2002; ISSN: 0569-5503; pp. 920-923.

(Continued)

*Primary Examiner* — Duy T Nguyen

(57) ABSTRACT

A RF power amplifier module comprises a die with a RF power transistor and the RF power transistor comprises a control terminal, a transistor output terminal and a transistor reference terminal. The RF power amplifier module further comprises a module input terminal, a module output terminal and at least two module reference terminals being electrically coupled to the control terminal, the transistor output terminal and the transistor reference terminal, respectively. The RF power amplifier module further comprises an electrically isolating layer and a heat conducting element. The die is in thermal contact with the heat conducting element via the electrically isolating layer in order to transfer heat during operation of the RF power transistor to the heat conducting element.

19 Claims, 9 Drawing Sheets

(51) Int. Cl.
*H03F 3/213* (2006.01)
*H01L 23/66* (2006.01)
*H03F 1/08* (2006.01)
*H03F 1/30* (2006.01)
*H03F 3/24* (2006.01)

(52) U.S. Cl.
CPC ............. *H01L 2924/19107* (2013.01); *H03F 2200/447* (2013.01); *H03F 2200/451* (2013.01)

(56) References Cited

U.S. PATENT DOCUMENTS

| | | | |
|---|---|---|---|
| 4,543,544 A | 9/1985 | Ziegner | |
| 5,105,172 A | 4/1992 | Khatibzadeh et al. | |
| 5,272,450 A | 12/1993 | Wisherd | |
| 5,294,897 A | 3/1994 | Notani et al. | |
| 5,663,597 A | 9/1997 | Nelson et al. | |
| 5,752,182 A | 5/1998 | Nakatsuka et al. | |
| 6,023,080 A * | 2/2000 | Kojima | H01L 23/66 257/275 |
| 6,211,462 B1 | 4/2001 | Carter, Jr. et al. | |
| 6,380,623 B1 * | 4/2002 | Demore | H01L 23/50 257/173 |
| 6,455,925 B1 * | 9/2002 | Laureanti | H01L 23/3677 257/678 |
| 6,664,935 B1 | 12/2003 | Thompson et al. | |
| 6,859,115 B1 | 2/2005 | Hirsch et al. | |
| 7,187,256 B2 | 3/2007 | Oran | |
| 8,030,763 B2 | 10/2011 | Romero et al. | |
| 2004/0238211 A1 * | 12/2004 | Momokawa | H05K 1/0201 174/260 |
| 2007/0235855 A1 | 10/2007 | Bokatius et al. | |
| 2011/0001576 A1 | 1/2011 | Lee et al. | |
| 2013/0033325 A1 | 2/2013 | Ladhani et al. | |

OTHER PUBLICATIONS

Wojnowski, M. et al., "Package Trends for Today's and Future mm-Wave Applications," 38th European Microwave Conference 2008 (EuMIC 2008); 55 pages.

* cited by examiner

STRUCTURE FOR A RADIO FREQUENCY POWER AMPLIFIER MODULE WITHIN A RADIO FREQUENCY POWER AMPLIFIER PACKAGE

CROSS REFERENCE TO RELATED APPLICATION(S)

The present application claims priority to International Patent Application No. PCT/IB2014/000807, entitled "A RADIO FREQUENCY POWER AMPLIFIER MODULE AND A RADIO FREQUENCY POWER AMPLIFIER PACKAGE," filed on Apr. 17, 2014, the entirety of which is herein incorporated by reference.

FIELD OF THE INVENTION

This invention relates to a radio frequency power amplifier module and a radio frequency power amplifier package. The invention further relates to a radio frequency power amplifier integrated circuit module, to a printed circuit board and to a base station used in mobile communications systems.

BACKGROUND OF THE INVENTION

Radio frequency power amplifiers are devices typically comprising a large RF power amplifier transistor that amplifies a RF signal and transfers the RF signal to a load termination through an impedance matching circuit. RF power amplifier transistors are typically integrated in an active die which is typically arranged in a package.

FIG. 1 schematically shows a cross-section of a typical package 1 used in prior art solutions for RF power amplifier of base stations of a suitable communications network. FIG. 2 shows a top view of the same package 1. The cross-section shown in FIG. 1 is taken along the line I-I schematically drawn in FIG. 2. The package 1 comprises a metal flange 2 with on a top side thereof an electrically isolating window frame 3 attached thereto. The flange 2 and the window frame 3 form a cavity. In the cavity, an active semiconductor die 4 is situated on the top side of the flange 2. The package 1 comprises an input lead L1 and an output lead L2 fixated on the isolating frame 3 at respective opposite lateral sides L1,L2, such that the leads extend outwards in a lateral direction and overlap with a top surface of an external printed circuit board PCB, when the flange 2 is positioned in a cavity or window of the PCB. The leads L1, L2 are connected with bondwires G1 and D1 to a corresponding input terminal and to a corresponding output terminal of an RF power amplifier transistor integrated in the active die 4. The active die 4 may comprise, additionally to the RF power amplifier transistor, active or passive components such as for example integrated inductors or capacitors for impedance matching. Although not shown in FIGS. 1 and 2, the open top side of the package is typically closed off, e.g. by a mold compound.

Typically, the metal flange 2 of the package 1 is bolted down to a heat sink 5 (or base plate 5) while the input lead L1 and the output lead L2 may be soldered to the external printed circuit board PCB. The heat sink 5 (or base plate 5) may also be part of the printed circuit board PCB on which the package 1 is mounted. Typically, the heat sink 5 may be electrically in contact with a conductive bottom ground layer 6 of the printed circuit board PCB. A bottom side of the active die 4 is typically attached to and physically in contact with the top side of the metal flange 2. A reference terminal of the RF power transistor is connected to the bottom side of the active die 4, which in turn may be connected to the ground potential via the metal flange 2 and the heat sink 5. The metal flange 2, the heat sink 5 and the bottom ground layer 6 of the printed circuit board PCB thus provide a path to ground for the RF power transistor.

However, this typical package suffers from instability, as well as poor predictability of input and output matching impedances.

SUMMARY OF THE INVENTION

The present invention provides a radio frequency power amplifier module, a radio frequency power amplifier package, a radio frequency power amplifier integrated circuit module, a printed circuit board, and a base-station as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings.

FIG. 11b shows a cross-section of an example of a physical implementation of a power amplifier integrated circuit module having the characteristics of the circuit shown in FIG. 11a.

FIG. 12b shows a cross-section of an example of a physical implementation of a power amplifier integrated circuit module having the characteristics of the circuit shown in FIG. 12a.

Elements in the FIGS. are illustrated for simplicity and clarity and have not necessarily been drawn to scale. In the FIGS., elements which correspond to elements already described may have the same reference numerals.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 3:
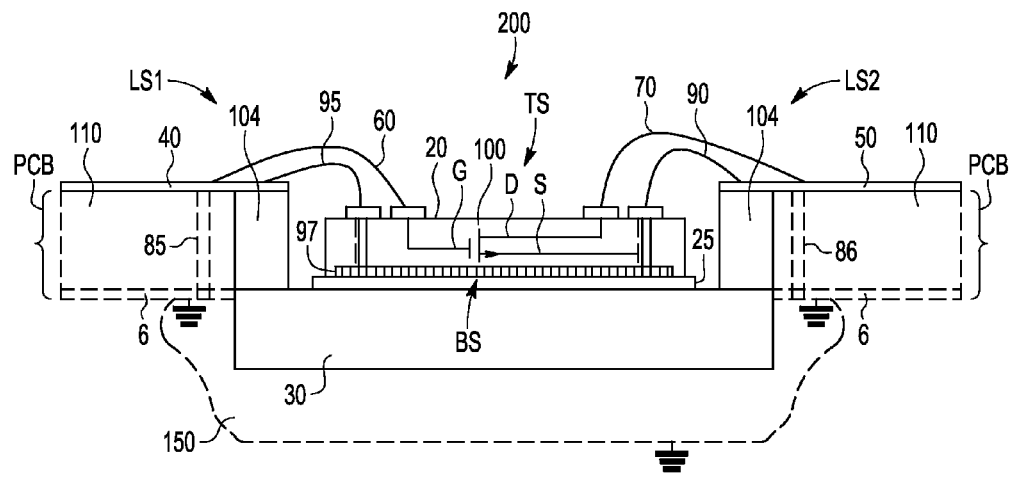
FIG. 3 schematically shows a cross-section of an example of a radio frequency power amplifier module taken along the line III-III in FIG. 4.
Figure 4:
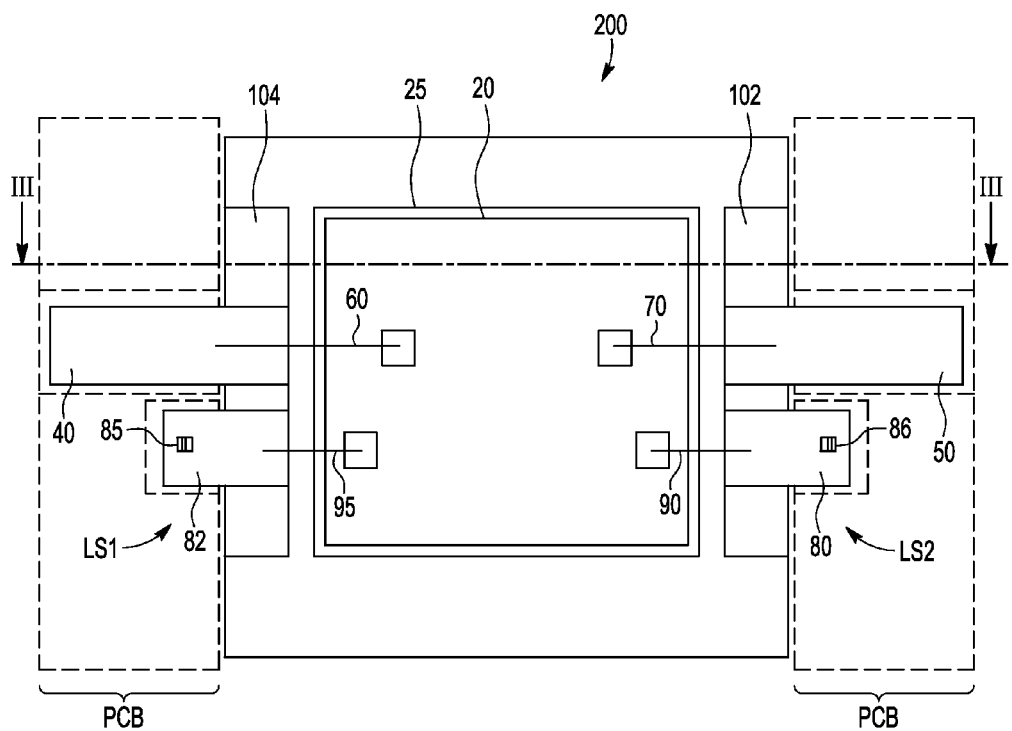
FIG. 4 schematically shows a top view of the example shown in FIG. 3.
Figure 5:
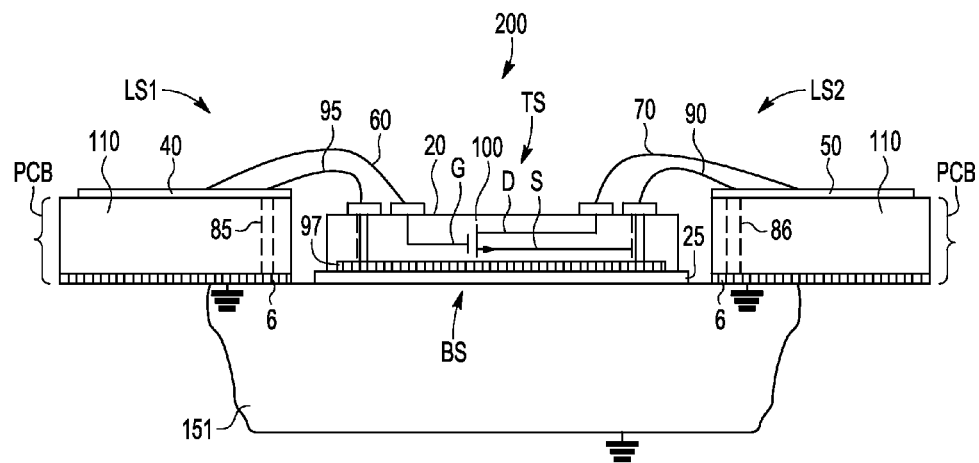
FIG. 5 schematically shows a cross-section of another example of a radio frequency power amplifier module taken along the line V-V in FIG. 6.

Referring to FIGS. 3 and 4, the example of a radio frequency power amplifier module 200 is implemented as a radio frequency power amplifier package mountable on a PCB with a flange 30 mountable on a separate heat sink 150. However, alternatively, the RF power amplifier module 200b may be also be provided as a package-less and be mounted directly on a heat sink 151 together with a printed circuit board PCB as shown in the example of FIG. 5.

The RF power amplifier module 200 comprises an integrated circuit die 20, hereinafter referred to as the die 20, provided with a radio frequency power transistor 100. The RF power transistor 100 has three terminals: an input terminal or control terminal G, an output terminal D and a reference terminal S. In case, as with the example of FIGS. 3 and 4, of a RF power Field Effect Transistor, the input terminal G, the output terminal D and the reference terminal S are respectively a gate terminal, a drain terminal and a source terminal of the RF power transistor 100 shown in FIG. 3.

The RF power amplifier module 200 shown in FIG. 3 and FIG. 4 further comprises a module input terminal 40 which is electrically coupled to the input terminal G, a module output terminal 50 which is electrically coupled to the output terminal D and at least two module reference terminals 80 and 82 which are electrically coupled to the reference terminal S. The module input terminal 40 and some, in this example one, reference terminals 82 are located at a first lateral side LS1 of module whereas the module output terminal 50 and the rest, in this example one, of the reference terminals 80 are located at a second lateral side LS2 of the module opposite to the first lateral side LS1. The die 20 is in lateral direction from the first lateral side to the second lateral side situated between the two sides LS1, LS1, and situated in a cavity formed by the flange 30 or heat sink 151 and a window frame, which in this example comprises a bar 102, 104 at each of the lateral longitudinal sides respectively, and which is open at the two other transverse sides of the module, as more clearly seen in FIG. 4. The window frame 102, 104A thus defines the lateral sides of the module and as shown, the window frame 102, 104 is provided on the top surface of the flange and the die 20 is attached to the flange 30 in a die attach region thereof defined by the inside walls of the bars 102, 104 defining the window frame and the edge of the flange 30 at the open side of the window frame.

The module input terminal 40, the module output terminal 50 and the at least two module reference terminals 80 and 82 may be respectively an input lead, an output lead and at least two respective reference leads of a power amplifier package, as schematically shown in FIG. 4. As shown, the leads protrude extent and beyond the respective lateral side in a horizontal direction (i.e. parallel to the top surface of the flange 30). The leads are attached on the window frame, which thus holds the leads relative to the flange 30, and which separates the leads from the flange 30. The bars, and generally the window frame, may be from an electrically isolating material, such as an insulating ceramic material. The module input terminal 40, the module output terminal 50 and the at least two module reference terminals 80 and 82 are used to electrically connect the die 20 at a first side TS of the die 20, facing away from the flange 30 and/or heat sink 150, 151, to an electronic circuit external to the RF power amplifier module 200. The electronic circuit may be implemented in a PCB where the RF power amplifier module 200 is mounted, e.g., mounted in a window formed by a cavity or passage of the PCB as shown in the FIGS. The electronic circuit may comprise discrete or integrated external components or devices, e.g., discrete inductors or capacitors or other dies integrating integrated inductors or integrated capacitors, used to e.g., supply the RF power transistor 100, provide external matching circuits, etc.

Figure 6:
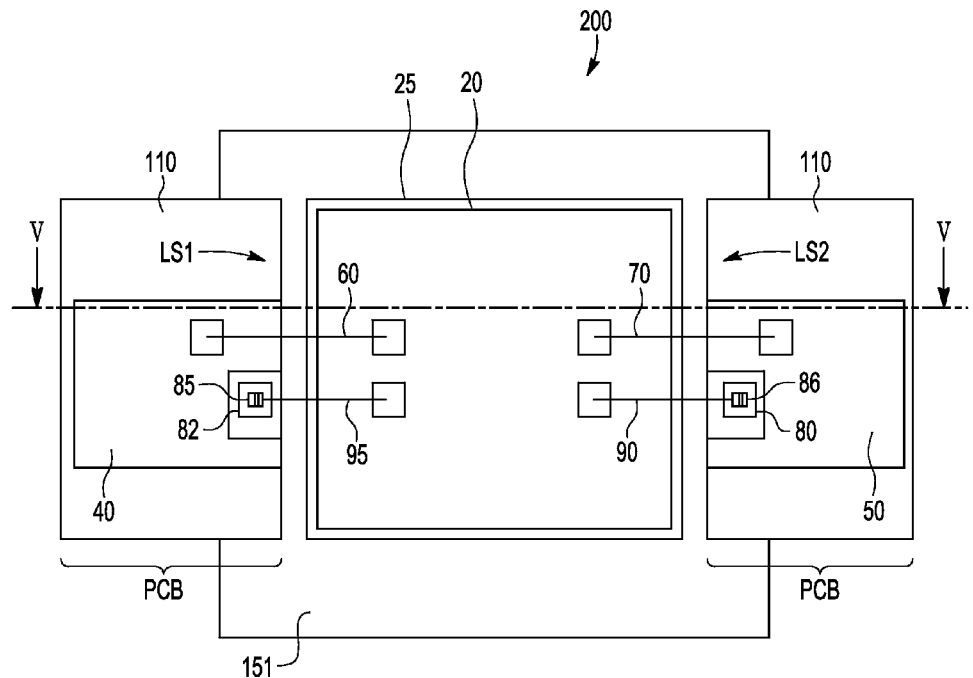
FIG. 6 schematically shows a top view of the example shown in FIG. 5.

Still referring to the example of FIGS. 3 and 4, the RF power amplifier module 200 further comprises an electrically isolating layer 25 and a heat conducting element both located on a second side BS, e.g., in this example the bottom side, of the die 20 opposite to the first side TS and facing the heat conducting element. The electrically isolating layer 25 is in direct contact with the die 20 at the second side BS and the heat conducting element is in direct contact with the electrically isolating layer 25 at its bottom. The heat conducting element 30 is separated from the die 20 by the electrically isolating layer 25. The heat conducting element may be a flange 30 of a package, e.g., as described in the "background of invention" or, as shown in FIGS. 5 and 6 a heat sink 151. The electrically isolating layer 25 allows blocking, or at least reducing, return RF currents circulating from the module input terminal 40 or module output terminal 50 back to the reference terminal S of the RF power transistor 100 through the flange 30. Thereby, stability and predictability of input and output matching impedances may be improved.

Figure 1:
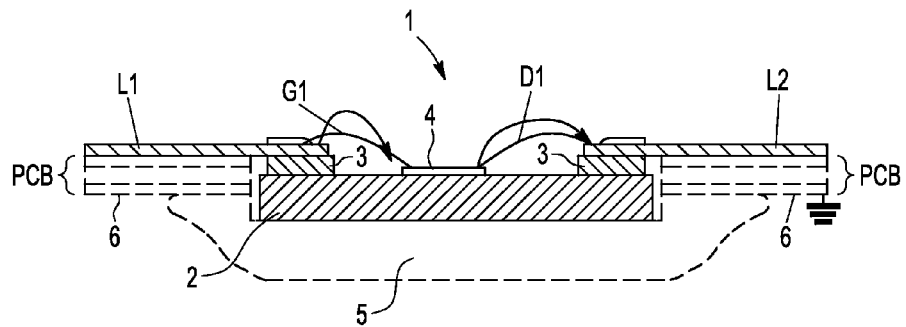
FIG. 1 schematically shows a cross-section of a radio frequency power amplifier package taken along the line I-I in FIG. 2.
Figure 2:
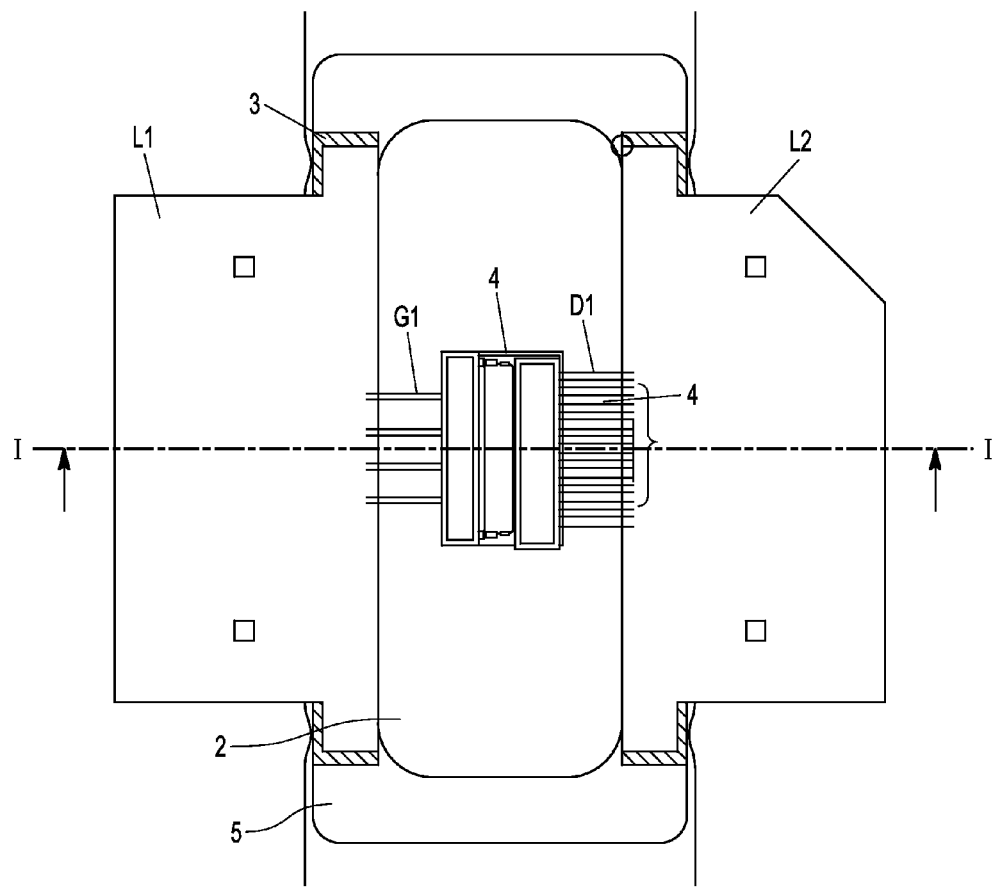
FIG. 2 shows a top view of the power amplifier package of FIG. 1.

Without wishing to be bound to theory, it is found by the inventors that the instability, poor predictability of input and output matching impedances and poor ruggedness of the known high frequency power amplifier (as shown in FIGS. 1 and 2) find at least partially their origin in that the metal flange 2 introduces an undesired parasitic inductance between the reference terminal of the RF power amplifier transistor, the heat sink 5 and the bottom ground layer 6 of the printed circuit board PCB. This parasitic inductance is difficult to control because the electrical and mechanical connection between the active die 4 and the metal flange 2, the metal flange 2 and the heat sink 5, and between the bottom ground layer 6 of the printed circuit board PCB and the heat sink 5 can be poorly controlled. This undesired parasitic inductance may create a feedback path between the bottom ground layer 6 of the printed circuit board PCB and the reference terminal of the RF power amplifier transistor through the heat sink 5 and the metal flange 2, allowing a return current to flow through this feedback path. This return current in turn cannot be accurately controlled because it spreads on the top surface of the metal flange 2 and flows back to the reference terminal of the RF power transistor. The poorly controlled return current flowing through the feedback path in turn generates undesired cross-couplings between different parts of the RF power transistor and/or the active or passive additional components. Further, in case two or more active dies are arranged next to each other on the same metal flange 2, e.g., two active dies with two RF power transistors, each on a respective die, configured in a push pull or Doherty power amplifier topology, the cross-couplings can be also generated across and in between the two RF power transistors. The undesired cross-couplings cause electromagnetic field deformation and asymmetry in the high frequency signal driving the input terminal of the RF power transistor and asymmetry in the amplified high frequency signal generated at the output terminal of the RF power transistor.

However, by electrically isolating the die 20 and the reference terminal S from the heat conducting element, such as flange 30, at the bottom side BS of the die 20, the return RF currents are at least confined to the respective edge of flange 30 adjacent to the module input terminal 40 and to the module output terminal 50. Confining the return RF currents into the edges of the flange 30 at the lateral sides LS1 and LS2 of the RF power amplifier module 200 allows keeping the distribution of the return RF currents in a smaller area of the flange 30 and improving the performance of the RF power amplifier module 200 during operation of the RF power transistor 100.

The electrically isolating layer 25 may be implemented in any manner suitable to transfer heat away from the die to the heat conducting element while further ensuring that there is no electrically conductive connection from the bottom of the die 20 to the flange 30. The electrically isolation layer 25 may be for example an electrically isolating epoxy or another type of suitable non-conductive adhesive with suitable thermal conductivity. The adhesive may be organic or anorganic. The electrically isolating layer 25 may be for example made of an epoxy resin suitable for RF power amplifier applications, such as Epo-Tek P-1011. The electrically isolating layer 25 may have a very high relative dielectric constant. The electrically isolating layer 25 may have for example a relative dielectric constant above 50, such as in a range between 90 and 150 (as is commercially available in the market). However, the relative dielectric constant may be higher. The electrically isolating layer 25 may also be a so-called ultra high dielectric epoxy with a filler, such as silver compounds, with dielectric constant up to 2000, such as for example disclosed in Yang Rao; Wong, C. P., "Ultra high dielectric constant epoxy silver composite for embedded capacitor application," *Electronic Components and Technology Conference, 2002. Proceedings. 52nd*, vol., no., pp. 920,923, 2002, incorporated herein by reference. The electrically isolating layer 25 may provide at the same time a good electrical isolation between the die 20 and the first side of the flange 30, a reliable mechanical attachment of the die 20 to flange 30, and a good thermal conductivity to transfer heat from the die 20 to the flange 30. The electrically isolating layer 25 may have a thickness of for example 5 to 10 micrometer or any other suitable thickness for a suitable heat dissipation and reliable mechanical attachment of the die 20 to the flange 30. It is found that for a material with dielectric constant between 3 and 4.5 a thermal conductivity of between 1 and 1.5 W/mK a thickness of 5 to 10 micrometer yields a good electrical isolation and a good thermal coupling between die and heat conducting element. However, in case of a higher thermal conductivity or lower dielectric constant the thickness may be higher, whereas in case of a lower thermal conductivity or higher dielectric constant the thickness may be lower.

It will be apparent that between the electrically isolating layer 25 and the die, and between the electrically isolating layer 25 and the heat conducting element that other electrically conducting or isolating layers may be present, and that the electrically isolating layer 25 may be part of a stack of layers between the die 20 and the heat conducting element 30, 151.

The die 20 may be any suitable type of die 20. The die 20 may comprise, additionally to the RF power transistor 100, extra active or passive components. The RF power transistor 100, and other electrical components on the die 20, may be provided using known semiconductor manufacturing techniques by successive depositions, patterning and removal of layers of conducting/isolating or semiconducting materials, and may be fabricated with any semiconductor technology suitable for high frequency and high power applications, e.g., with Gallium Arsenide (GaAs) or laterally diffused MOS or gallium Nitride or SiC (Silicon Carbide) technologies, etc. For example, the RF power amplifier module may be, as shown in the examples of FIGS. 11-12, an RF power amplifier integrated circuit module including the RF power transistor 100 and further including a shunt capacitor Cenv and a radio frequency capacitor C_RF to stabilize a DC voltage supply powering the RF power transistor 100 and/or to provide impedance transformation to an input impedance at the control terminal G or to an output impedance at the transistor output terminal D, respectively, of which some are provided on the die.

The bottom of the die 20 may be conductive and electrically coupled to the reference terminal S of the RF power transistor 100. As shown in FIG. 3, the die 20 of the RF power amplifier module 200 may comprise a patterned or blanket conductive layer 97 electrically coupled to the reference terminal S of the RF power transistor 100 and directly adjacent to the electrically isolating layer 25. The conductive layer 97 may be in thermal contact with the electrically isolating layer 25 in order to transfer heat, e.g., thermal energy, to the electrically isolating layer 25 through conduction. Thus, the die 20 may be thermally coupled to the flange 30 through the conductive layer 97 and the electrically isolating layer 25.

The conductive layer 97 may be located at the bottom side of the die 20 adjacent to the electrically isolating layer 25 and extend over the bottom surface of the die 20. The conductive layer 97 may be a thick metal layer, e.g., a few um thick to spread the heat generated during the operation of the RF power transistor 100 to the flange 30 and to the heat sink 150 through the electrically isolating layer 25. The conductive layer 97 may be a blanket layer extending over the entire bottom surface of the die 20 and may be unpatterned or patterned. The conductive layer 97 is electrically isolated from the flange 30 by the electrically isolating layer 25, and there is no electrical connection between the conductive layer 97 and the flange 30. The flange 30 may be connected through the bottom reference layer 6 of the printed circuit board PCB to the ground. The reference terminal S is connected through the reference bondwires 90 and 95 and the respective conductive vias 85 and 86 through the isolation material 110 to the bottom reference layer 6 of PCB.

The RF power transistor 100 may be any suitable type of RF power transistor, for example suitable to operate in the radio frequency range or in the microwave frequency range or in any high frequency range suitable for wireless transmission. For example, the RF power transistor 100 may be a final stage, an intermediate stage, or a driver stage of a RF power amplifier. The RF power transistor 100 of FIG. 3 is a FET device, such as an LDMOS FET. Alternatively, for example, the RF power transistor 100 may be a hetero-junction bipolar transistor (HBJT) or a metal-semiconductor field effect transistor. The reference terminal S of the RF power transistor 100 may be connected to a reference potential, e.g., the lowest available potential such as ground or a negative supply voltage. The RF power transistor 100 may be typically arranged in a common source configuration in which case the reference terminal S is a common reference to the input terminal G and to the output terminal D of the RF power transistor 100.

The module terminals may be electrically coupled to the terminals of the RF power transistor in any manner suitable for the specific implementation, e.g., through electrically conductive elements. In the example of FIGS. 3 and 4, the module input terminal 40 is electrically coupled to the control terminal G of the RF power transistor through an input electrically conductive element 60 100 at the first side TS, e.g., in this example the top side, of the die 20 through an input electrically conductive element 60. The module output terminal 50 is electrically coupled at the first side TS of the die 20, to the transistor output terminal D through an output electrically conductive element 70. The two module reference terminals 82 and 80 are electrically coupled through a first reference electrically conductive element 95 and a second reference electrically conductive element 90, respectively. The module reference terminals 80 and 82 may further be electrically coupled to a reference potential, e.g., ground. The module reference terminals 82 and 80 may be for example connected through conductive vias 85 and 86 (shown in the cross-section of FIG. 3 with dashed lines and in the top view of FIG. 4 with squares) through a dielectric material 110 to a bottom reference layer 6 of the printed circuit board PCB connected to ground as shown in FIGS. 3 and 4. The conductive vias 85 and 86 are in this example implemented through the dielectric material 110 of the PCB. However, as shown in the example of the FIGS. 7 and 8, the conductive vias may be implemented through the dielectric bars 106 and 108.

The electrically conductive elements can, as shown in FIG. 3 and FIG. 4, be bondwires 60, 70, 90, 95. The bondwires are in this example bonded at one end on respective bondpads on top of the die 20 and on the other end on top of the respective module terminal 50, 60, 82 and 80. The bondpads are in turn electrically connected to the input terminal G, the output terminal D and the reference terminal S of the RF power transistor 100 through suitable electrical connections in die 20. However, other types of electrically conductive elements may be used, such as for example metal strip lines soldered or pressed to the respective bondpads on the die 20. The metal strip lines may be deposited on a plastic substrate or any other suitable RF dielectric substrate. The dielectric substrate may be part of the power amplifier module 200, or part of a printed circuit board PCB on which the RF power amplifier module 200 is mounted, such as dielectric layer of a multi-metal layer printed circuit board PCB.

The heat conducting element may be implemented in any manner suitable to conduct heat away from the die in the specific implementation. As mentioned, the heat conducting element may e.g. be a flange which is arranged at the bottom side BS of the die 20 and further serves to mechanically hold the die 20. The flange 30 may be used to mount the RF power amplifier module 200 for example in a radio frequency power amplifier package and in a printed circuit board PCB. The flange 30 may be electrically conductive and electrically connected to the bottom reference layer 6 of the printed circuit board PCB (together with the heat sink 150 if present). The bottom reference layer 6 of the printed circuit board PCB may be connected to ground as shown in FIG. 3.

During operation of the RF power transistor 100, heat is generated which may need to be dissipated away from the RF power transistor 100. The heat is transferred from the die 20 to the flange 30 through the electrically isolating layer 25. The die 20 of FIG. 3 is in thermal contact with the flange 30 through the electrically isolating layer 25.

As shown in FIG. 3 and FIG. 4, the flange 30 may be made of an electrically conductive material and the module reference terminals 80 and 82 may be electrically connected to the flange 30. The reference terminal S may be electrically connected to the module reference terminals 80 and 82, in this example through the reference bondwires 90 and 95. The reference module terminals 80 and 82 may be connected with conductive vias 86 and 85 through the dielectric material 110 of the PCB to the bottom layer 6 of the PCB, which is thus electrically connected to the flange 30. The flange 30 may extend from underneath the die 20 to below the dielectric material 110 and be in contact with the bottom layer 6 of the PCB.

The RF power amplifier module may comprise (or as shown in FIGS. 3-4 and 7-8 be mounted on) an additional heat conducting element, such as a heat sink. The heat may be further transferred from the flange 30 to the heat sink 150 in contact with the flange 30 at a bottom side of the flange 30, or from another type of heat conducting element to the additional heat conducting element. As shown, the heat sink 150 may be an additional heat conducting element in contact with the flange 30 at a bottom side of the flange 30 to cooperate with the flange 30 to dissipate the heat generated during operation of the RF power transistor 100. The heat sink 150 may be an external element to the RF power amplifier module 200, e.g., it may be part of the PCB or it may be a base plate on which the PCB and the RF power amplifier module 200 are mounted. The heat sink 150 may be a separate element, separated from the electrically isolating layer 25, by the flange 30. However, as shown in FIG. 5, the heat sink 151 may be part of the RF power amplifier module 200 and may replace the flange 30 and/or the combination of flange 30 with the heat sink 150. In this example the heat sink 151 may be in direct contact with the electrically isolating layer 25.

As shown in FIGS. 5 and 6, instead of mounting on a flange as in the example of FIGS. 3 and 4, the die 20 may be mounted, together with the PCB directly on the heat sink 151. The die 20 may be mounted as a bare die without a package, on the heat sink 151. The die 20 is separated from the heat sink 151 by the electrically isolating layer 25. The input module terminal 40, the output module terminal 50 and the reference module terminals 82 and 80 are electrically coupled to corresponding input, output and reference terminals on the PCB. As shown, conductive vias 85 and 86 extend from a top surface of the PCB to a bottom conducting layer, through the dielectric material 110 of the PCB. The conductive vias 85 and 86 electrically connect the reference module terminals 82 and 80 to the bottom layer 6 of the printed circuit board PCB. In the examples shown through the FIGS. 3 to 6, the flange 30 and the heat sink 151 are made of electrically conducting materials and connected to the reference potential via the bottom layer 6 of the PCB.

However, the flange and the heat sink may be made of electrically isolating materials and/or not be connected to the reference potential, e.g., left floating. Referring to the example of FIGS. 7 and 8, for instance, the power amplifier module 200 differs from the power amplifier module 200 shown in FIGS. 3 and 4 in that the module reference terminals 82 and 80 are electrically isolated from the flange 30. The electrically isolation of the module reference terminals 82 and 80 from the flange 35 allows eliminating, or at least reducing to for the implementation negligible amount, the flow of the RF return current through the flange 30.

Figure 7:
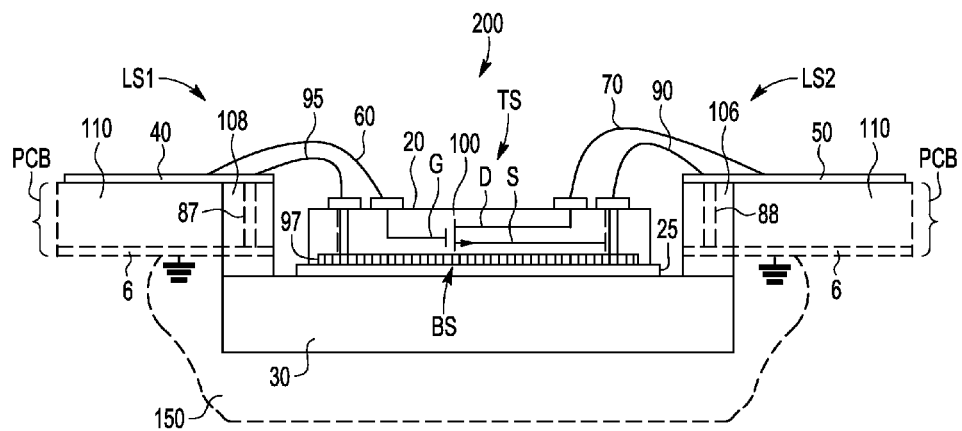
FIG. 7 schematically shows a cross-section of an example of a radio frequency power amplifier module taken along the line VII-VII in FIG. 8.
Figure 8:
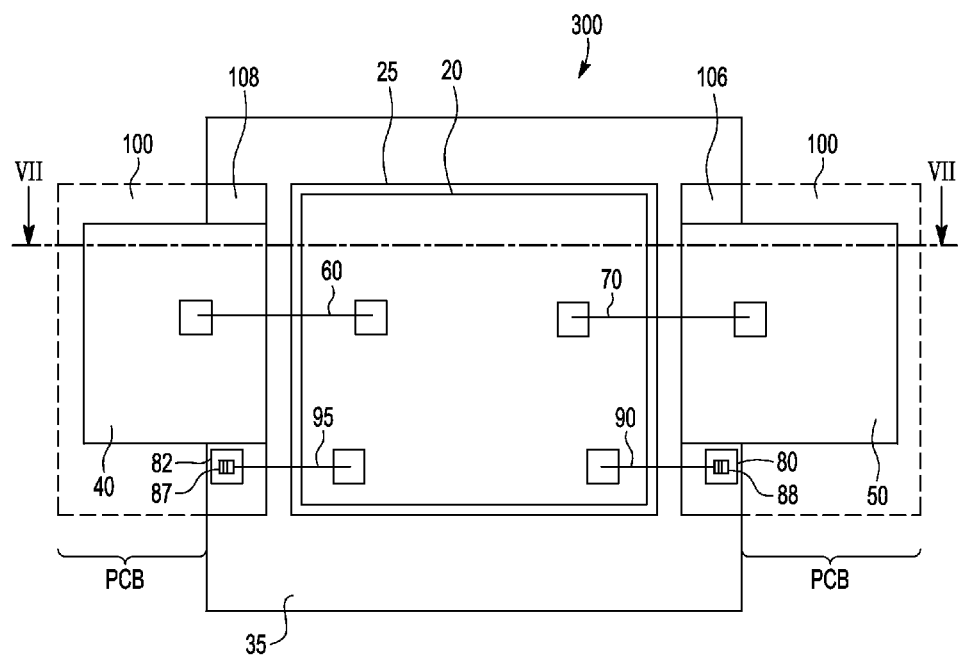
FIG. 8 schematically shows a top view of the example shown in FIG. 7.

In the example of FIG. 7 and FIG. 8, the bottom layer 6 is isolated from the flange 30 and electrically connected to the ground potential (and to the heat sink 150, in this example by a direct physical contact between the bottom layer 6 and the heat sink 150). The flange 30, in turn does not provide an electrical path from or to the heat sink 150, e.g., by appropriate electrical isolation of the flange or by choosing a suitable electrically isolating material for the flange.

Electrically isolating the module reference terminals 82 and 80 from the flange 30 allows removing the flange 30 from the path of the return currents generated in the RF power amplifier module 200 during operation of the RF power transistor 100. The return currents creating the current to voltage feedback may flow only through the reference bondwires 95 and 90 and through the conductive layer 97 on the die 20 back to the reference terminal S of the RF power transistor 100. In other words the sensitivity of the return currents are to the physical dimensions, shape and/or type of material of the flange 30 is reduced. This allows designing the flange 30 to be smaller and cheaper than a corresponding flange (e.g., the flange of FIGS. 1 and 2) made of conductive material and electrically connected to the bottom of the active die.

Further, during manufacturing of a power amplifier module the spread of the relative position of the flange with respect to the die, or the spread of the quality of the electrical contact between the flange and the die have less influence on the distribution of the return currents through the flange. This renders the stability and the gain performance of the power amplifier module sensitive to the variations in the manufacturing process.

Additionally because the heat conducting element, e.g., in the example the flange and/or the heat sink, contribute less or at all to the parasitic ground inductance of the RF power transistor during RF operation, the electrical characteristics of the RF power amplifier module can be made less sensitive to variations in the positioning, e.g., of the module relative to the printed circuit board PCB, the die relative to the flange, the flange relative to the heat sink, etc. It should be noted that input and output impedances in power transistors, e.g., in a 100 to 200 W power range, are very low, e.g., in the order of 0.4 to 1 Ohm. At these low impedance levels even small deviations of the position of the power amplifier module with respect to the printed circuit board PCB, e.g., in a range of 0.1 to 0.3 mm, or a misplacement of the flange with respect to the heat sink may have a significant effect on impedance matching transformation. By reducing the sensitivity of the electrical characteristics of the RF power amplifier module to the variations in the manufacturing process, the electrical performance of the RF power transistor may be improved.

As shown the electrically isolating window frame, formed in this example by dielectric bars 106, 108, is provided with conductive vias 87, 88 extending from a top side of the window frame to a connect which allows to connect the vias to the bottom ground layer of the PCB. It will be apparent that, alternatively, the vias may extent to the heat conducting element, e.g., flange 30 in the example of FIGS. 3 and 4, to connect the reference terminals electrically to the heat conducting element.

As shown the module reference terminals 80, 82 are situated on the window frame and in direct contact to the conductive vias (said differently they are situated on top of the vias and physically and electrically in contact therewith. Similarly, the module reference terminal 82 may be electrically connected through a conductive via 87 to the bottom layer 6. The module reference terminals 80, 82 may thus be electrically connected, as shown, through the conductive via 88 (indicated as a dashed conduct through the dielectric bar 108) to the bottom layer 6 of the PCB.

It will be apparent that instead of the conductive vias, the module reference terminals 80, 82 may be connected to the PCB bottom layer 6 in another manner For example, the module reference terminals 82 and 80 may be formed on or electrically coupled to corresponding reference terminals of the printed circuit board PCB, e.g., similar to the example of FIGS. 5 and 6, and isolated or spaced from the module input terminal 40 and the module output terminal 50, and connected to the bottom layer 6 via suitable conductive vias in the PCB itself. In the latter example, the conductive vias 87 and 88 may be located directly on the printed circuit board PCB to electrically connect the module reference terminals 82c and 80c directly to the bottom layer 6 of the printed circuit board PCB which is connected to the reference potential.

As shown in the examples of FIGS. 3-6, the heat conducting element may be made of an electrically conducting material. However, as mentioned, alternatively it may be made of an electrically isolating material, for example BeO (Beryllium Oxide) or other dielectric material or ceramic material suitable to spread the heat of the RF power transistor 100 during operation to eventually transfer the heat away from the die. Beryllium Oxide is an effective electrically insulating material and has a thermal conductivity comparable to the thermal conductivity of conductive materials such as copper and may be effectively used as material. Thereby, return current through the flange 30 can effectively inhibited and for example the flange 30 or other heat conducting element may be used to e.g., form capacitor plates between the electrically isolating layer 25 and the flange 30 or other passive circuit elements, which together with a plate between electrically isolating layer 25 and the die 20 may form a capacitance.

As shown in the examples of FIGS. 3 to 8, the input bondwire 60 and the respective reference bondwire 95 may be arranged at the same first lateral side LS1 of the respective power amplifier module 200. Further, the input bondwire 60 may extend in a plane adjacent and parallel to a plane defined by the input reference bondwire 95. The output bondwire 70 and the reference bondwire 90 may be arranged at the second lateral side LS2 (opposite to the first lateral side LS1) of the power amplifier module 200. The output bondwire may extend in a plane adjacent and parallel to a plane defined by the output reference bondwire 90 at the second lateral side LS2. This allows reducing a forward-return current path through the input or output bondwires and the reference bondwires 95. Additionally this construction is more compact and undesired electromagnetic couplings may be reduced, e.g., avoided. The term "adjacent" as used in this context, indicates that a distance between the input or output bondwires 60, 70 (or other suitable conductive elements) from the respective reference parallel bondwires 90, 95 (or more precisely between the parallel planes when the bondwires extent in parallel planes), is smaller than the smallest distance of the input, output or reference bondwires (or other suitable conductive elements) from a top surface of the electrically and heat conducting element which is in physical contact with the bottom surface of the electrically isolating layer 25. Thereby, the mutual coupling between adjacent conductive elements will be stronger than the mutual coupling between the conductive elements and the electrically and heat conducting element (e.g., flange 30 and/or heat sink 150, 151).

Figure 9:
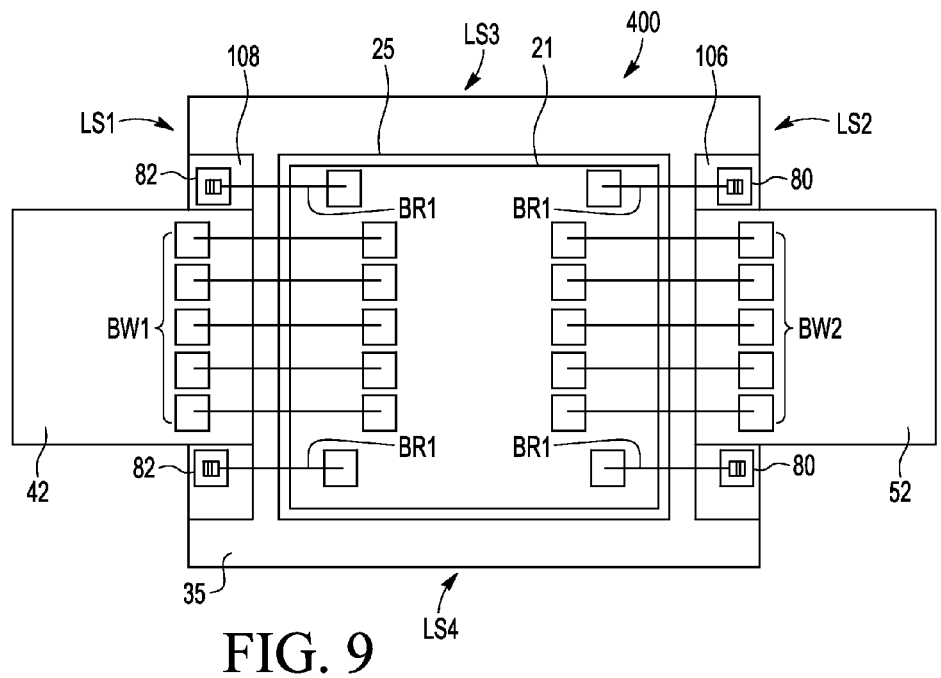
FIG. 9 schematically shows a top view of an example of a radio frequency power amplifier module.

Referring to the example of FIG. 9 for instance, the module may comprise an input array BW1 of input conductive elements (in this example, bondwires) connected in a parallel arrangement to one or more input contacts and an output array BW2 of output conductive elements connected in a parallel arrangement to one or more output contacts. The one or more input contacts and the one or more output contacts are located on a first surface of the die 21 at the first side, e.g., the top side of the die 21. The input conductive elements of the input array BW1 are electrically connected to the control terminal G. The output conductive elements of the output array BW2 are electrically connected to the transistor output terminal D.

The one or more input and the output contacts may be bondpads and formed by a single elongated contact or by a plurality of contacts located on the first side TS, e.g., the top side, of the die 21.

The power amplifier module 200 of FIG. 9 comprises at least two reference arrays BR1 and BR2 of mutually parallel arranged conductive elements, each one BR1 or BR1 of the arrays BR1 and BR2 being arranged at a first lateral side LS1 and at a second lateral side LS2, respectively. As shown, the first lateral side LS1 and at a second lateral side LS2 are defined by the bars 106,108 of the window frame, whereas head side LS3 and tail side LS4 are defined by the edge of the flange 30 (e.g., where the window frame is open). The conductive elements of the at least two reference arrays BR1 and BR2 are connected in a parallel arrangement to one or more reference contacts located on the first surface of the die 21 and are electrically connected to the transistor reference terminal S.

Each of the reference conductive elements of the at least two reference arrays BR1 and BR2 may be connected at one end to a reference bondpad located on the first side TS of the die 21. Each of the reference conductive elements of the at least two reference arrays BR1 and BR2 may be connected at another end to the respective module reference terminal at the respective lateral sides LS1 and LS2.

The reference conductive elements of a first one BR1 of the at least two reference arrays, BR1 and BR2, are arranged in parallel with the input conductive elements of the input array BW1, (e.g., extend in parallel planes, in the example perpendicular to the die surface top). Two consecutive reference conductive elements of the first reference array BR1 are separated by the input conductive elements of the input array BW1.

The reference conductive elements of a second one BR2 of the at least two reference arrays, BR1 and BR2, are arranged in parallel (e.g., extend in parallel planes, in the example perpendicular to the die surface top surface) with the output conductive elements of the output array BW2. Two consecutive reference conductive elements of the second reference array BR2 are separated by the output conductive elements of the output array BW2.

The construction of FIG. 9 may be used in a multi die RF power amplifier, such as a Doherty amplifier with two or more RF power transistors integrated in separated dies next to each other assembled in a package or mounted on a printed circuit board PCB. By placing the dies next to each other wherein each one of the die has the construction shown in FIG. 9, the common parasitic inductance ground path is reduced compared to standard solutions in which the ground plane (e.g., the flange of prior art solutions as shown in FIGS. 1 and 2) is common to both dies.

Figure 10:
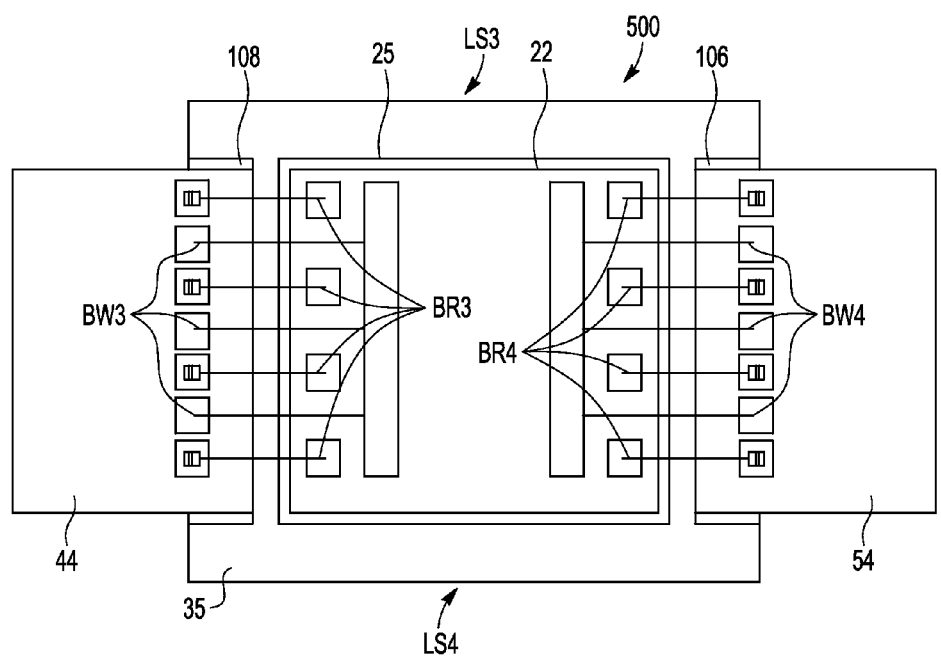
FIG. 10 schematically shows a top view of an example of a radio frequency power amplifier module.

As shown in the example of FIG. 10, the conductive elements of the first reference array BR3 may be interdigitated with the input conductive elements of the input array BW3 and the conductive elements of the second reference array BR4 are interdigitated with the output conductive elements of the output array BW4. This allows further reducing the mutual coupling between input and output module terminals in power amplifier packages containing multiple RF power transistors, for example connected in a Doherty or push-pull topology, because the forward RF currents flow directly to the input or output terminals G or D of the die 22, through the single input or output conductive elements of the input or output arrays BW3 or BW4, and the return RF currents flow back to the conductive layer 97 through the reference conductive elements of the respective reference arrays BR3 or BR4, thereby bypassing the flange 30 at the bottom of the die 22.

Figure 11B:
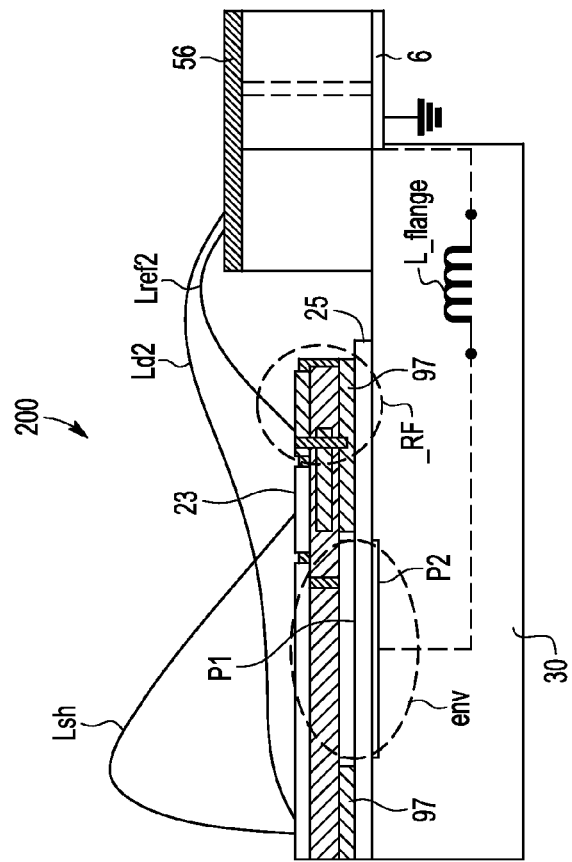
Figure 11A:
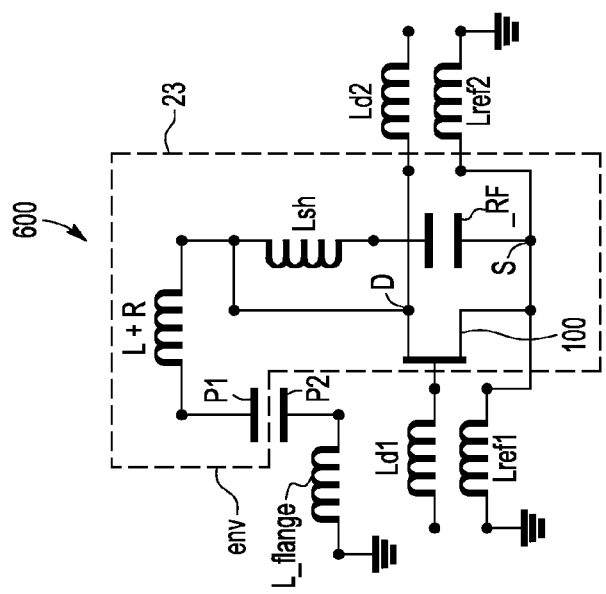
FIG. 11a schematically shows an equivalent circuit of a radio frequency power amplifier integrated circuit.

Referring to FIGS. 11-12, as shown therein, the RF power amplifier module may be provided with one or more integrated capacitors, for example connected to form a shunt capacitor as in the circuit schematic shown in FIG. 11*a*. The capacitors may be implemented in any suitable manner.

The circuit shown in FIG. 11*a* comprises the RF power transistor 100, the input conductive element Ld1, e.g., a bondwire, electrically conductively connecting the input terminal G of the RF power transistor 100 to the input module terminal (not shown in the cross-section of FIG. 11*b*) of the RF power amplifier integrated circuit module 200. The circuit further comprises an output conductive element Ld2, e.g., a bondwire, which connects the output terminal D of the RF power transistor 100 to the corresponding output terminal 56 of the RF power amplifier integrated circuit module 200 and reference bondwires Lref1 and Lref2, of which only bondwire Lref2 is shown in FIG. 11*b*, which connect the reference terminal S of the RF power transistor 100 to the respective reference terminals.

The electrically isolating layer 25 may be used as a dielectric layer for the shunt capacitor Cenv whose first plate P1 is integrated on the die 23 and second plate P2 corresponds to the part of the flange 30 (or heat sink 151 in the example of FIGS. 5 and 6) beneath the electrically isolating layer 25 overlapping the first plate P1. The shunt capacitor Cenv can be connected at one side (e.g., at the flange 30 side) to the reference potential through for example the grounded bottom layer 6 of the printed circuit board PCB as shown in FIG. 11*b*. The flange 30/heat sink 150 or the heat sink 151 depending on the construction chosen, introduces a parasitic inductance L_flange between the shunt capacitor Cenv and the reference potential as schematically shown in FIG. 11*b* with a dashed line connecting a first terminal of the inductor L_flange to the second plate P2 of the shunt capacitor Cenv and a second terminal of the inductor L_flange to the bottom layer 6.

The shunt capacitor Cenv serves to stabilize the DC supply voltage on the output terminal D in case of a sharply growing power surge, e.g., as caused by frequency components in the spectrum of a modulation signal modulating the amplified RF signal (e.g., the carrier signal). These frequency components in the spectrum of the modulation signal are part of so-called envelope or modulation currents which have frequency components typically lower, e.g., at least an order of magnitude, than the radio frequency of operation of the RF power transistor 100. The frequency components of the so-called envelope or modulation currents lie typically in a range below 200 MHz, whereas the RF frequency of the power transistor is typically above 1 GHz.

The shunt capacitor Cenv may be used in the same way at the input terminal G of the high frequency high power transistor 100. During a power surge of the input signal, the output power may reach up to 7 to 12 dB higher level than the average power, and the power amplifier will consume correspondingly more DC current. The shunt capacitor Cenv thus allows reducing high DC current consumption during said power surges, and to stabilize the DC supply voltage.

In the example of FIGS. 11*a*-11*b*, the shunt capacitor Cenv is entirely integrated in the RF power amplifier integrated circuit module or package 200 and serves as the discrete large DC capacitor used in prior art solutions. By implementing the shunt capacitor Cenv at a minimal distance from the RF power transistor 100, the above mentioned parasitic ground inductance L_flange is thus minimized or at least significantly reduced. The parasitic ground inductance of the electrically conductive flange 30, e.g., in the example of FIG. 3, or of the electrically conductive heat sink 151, e.g., in the example of FIG. 5, is negligible at frequencies below 200 MHz.

The power amplifier integrated circuit may, as shown, comprise an RF shunt capacitor C_RF entirely integrated on the die 23. The bottom plate of the RF shunt capacitor C_RF may be formed by a part of the bottom conductive layer 97 and electrically connected to reference terminal S of the high frequency high power transistor 100. The conductive layer 97 at the bottom of die 23 is connected through conductive vias to one or more bondpads at the top side of the die 23 which are then electrically connected to the module reference terminal and through vias to the PCB bottom ground layer 6, e.g., as shown in the example of FIGS. 3 and 4. The RF shunt capacitor C_RF may be used for pre-matching or in combination with the shunt capacitor Cenv and an integrated series resistor R integrated the die 23 as a larger DC capacitor.

Figure 12B:
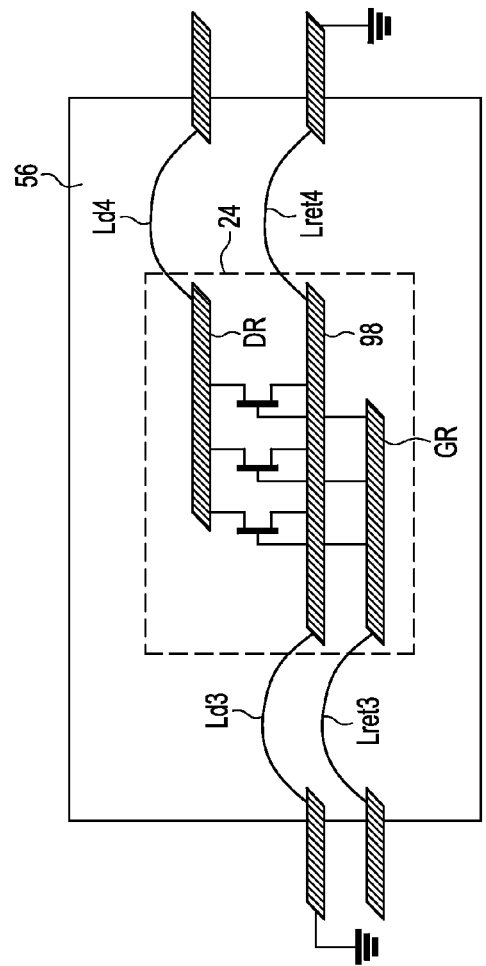
Figure 12A:
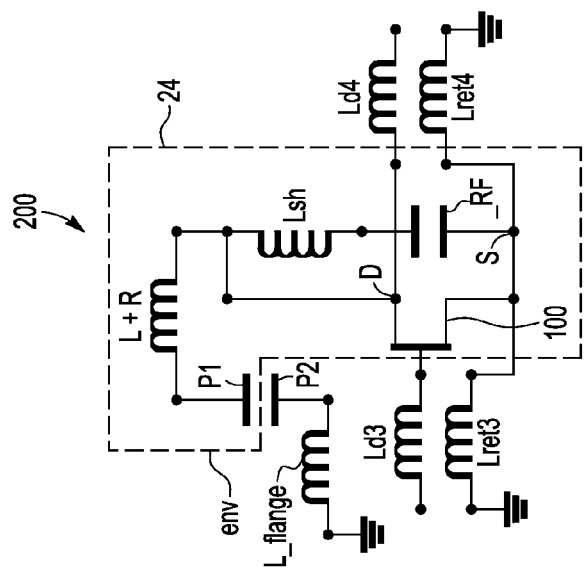
FIG. 12a schematically shows an equivalent circuit of a radio frequency power amplifier integrated circuit module.

Referring to the example of FIGS. 12a-12b, the electronic circuit in FIG. 12a is equivalent to that shown in FIG. 11a but the example of FIGS. 12a-12b differs from the example of FIGS. 11a-11b in the manner the capacitors are formed and in the manner the transistor input, output and reference terminals are connected. In this example, the transistor input, output and reference terminals are in fact connected all via metal strip lines running on a top surface of the die 24 as schematically shown with thick black lines in the top view of FIG. 12b. To explain further, the conductive layer, which may be still comprise a metal layer at the bottom of the die 24, as shown in FIG. 11b, may further comprise a metal strip line 98 arranged on the first side TS of the die 24 electrically connected to the metal layer at the bottom of the die 24 through vias. The metal strip line 98 may be a top metal layer of a stack of metal layers used for making interconnections in the die 24. The metal strip line 98 may be made of a relatively thick metal layer, e.g., between 1 and 10 micrometer. The power amplifier integrated circuit module 700 further comprises a so-called gate runner GR and a drain runner DR, e.g., also metal strip lines implemented on a surface at the first side TS (e.g., the top side of the die 24) of the die 24 opposite to the second side BS (e.g., the bottom side of the die 24) where the electrically isolating layer 25 is located. The gate runner GR and the drain runner DR may be implemented with the same top metal layer on the surface of the die 24.

The power amplifier integrated circuit module 700 confines the circulation of the high frequency forward and return currents at the first side TS (e.g., at the top side) of the die 24 opposite to the second side BS which is in contact with the electrically isolating layer 25. Since the need to route transistor terminal connections at the bottom side of the die is obviated, the conductive layer, e.g., the metal layer at the bottom of the die 24, may be a blanket bottom metal layer extending over the entire bottom surface of the die 24. As a consequence an area of the first plate P1 of the shunt capacitor Cenv can be as large as the entire bottom surface of the die 24 and a larger shunt capacitor Cenv compared to the example of FIGS. 11a-11b can be integrated between the die 24 and the flange 30.

It should be noted that the examples of FIGS. 11 and 12 can be provided with the multiple bondwire parallel arrangements array of the examples of FIGS. 9 and 10, thereby further improving the electromagnetic coupling.

Figure 13A:
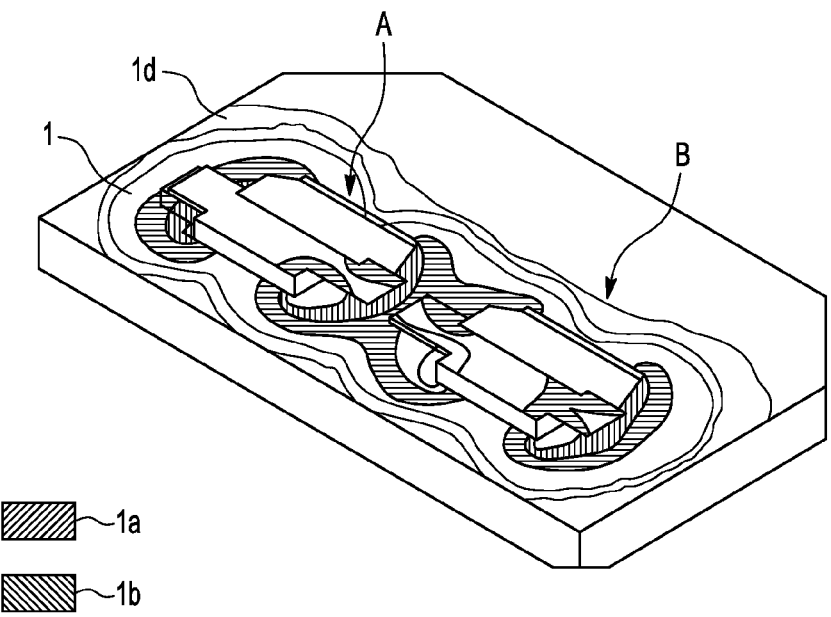
FIGS. 13a and 13b schematically show a three dimensional electromagnetic simulation of a radio frequency power amplifier module.
Figure 13B:
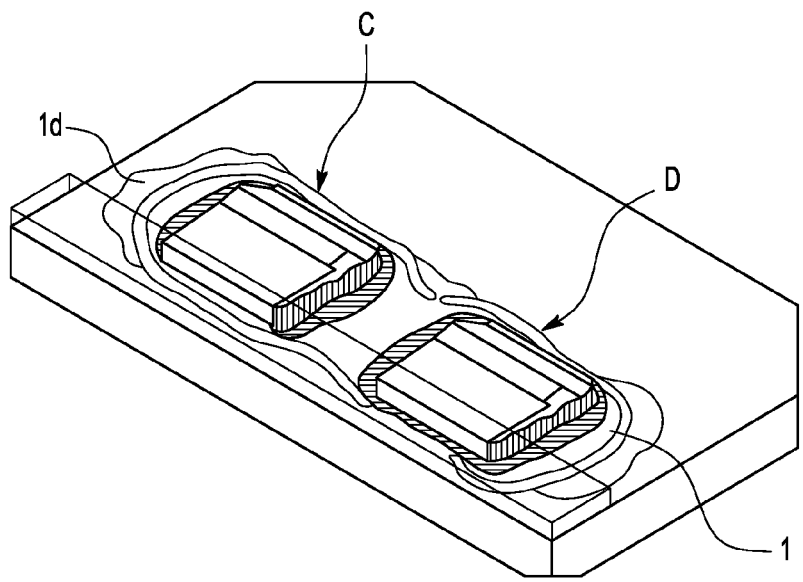

FIG. 13a and FIG. 13b schematically show a three dimensional electromagnetic simulation of such a Doherty configuration without electrically isolating layer and with electrically isolating layer. FIGS. 13a and 13b show with the different drawn regions 1a, 1b, 1c, 1d different magnitudes of the RF current circulating during a simulated operation of a power amplifier in a Doherty configuration. The regions 1a and 1d are drawn with different filled patterns as indicated in the FIGS. 13a and 13b, while the regions 1c and 1d are delimited by a thick black line drawn between the regions 1c and 1d. The left side active dies A and C (on the top side of each FIGS. 13a and 13b) integrates the main RF power transistor which is called the carrier or main amplifier and the right side active dies B and D (on the bottom side of each FIG.) integrates the peak power amplifier. The regions 1c and 1d in the FIGS. 13a and 13b indicate lower magnitude RF currents and the regions 1a and 1b indicate regions with higher magnitude RF currents. In FIG. 13a the regions 1a and 1b extend over the surface of the flange beneath the two active dies A and B and spread largely all around and in between the two active dies A and B. In FIG. 13b the regions 1a and 1b are more confined around each active die C and D of the Doherty amplifier keeping the return high frequency currents local to each active die C or D and improving thus the isolation between them. The electrically isolating layer thus not only largely decreases the electromagnetic cross-coupling between different parts of the RF power transistor integrated in each active die C or D, but also decreases the electromagnetic cross-coupling between the two RF power transistors integrated in the two active dies C and D.

FIG. 13c shows a comparison of FIG. 13b with FIG. 13a. The isolation is simulated between the input of the peak amplifier and the output of the main amplifier of the shown Doherty amplifier. At 2.1 GHz the isolation of FIG. 13a is −32 dB and in FIG. 13b −62 dB. The Doherty power amplifiers of FIG. 13a and of FIG. 13b are matched to the same frequency (e.g., at 2.1 GHz) in order to have low insertion losses at this frequency, as shown in the upper curves of the graph.

Figure 14:
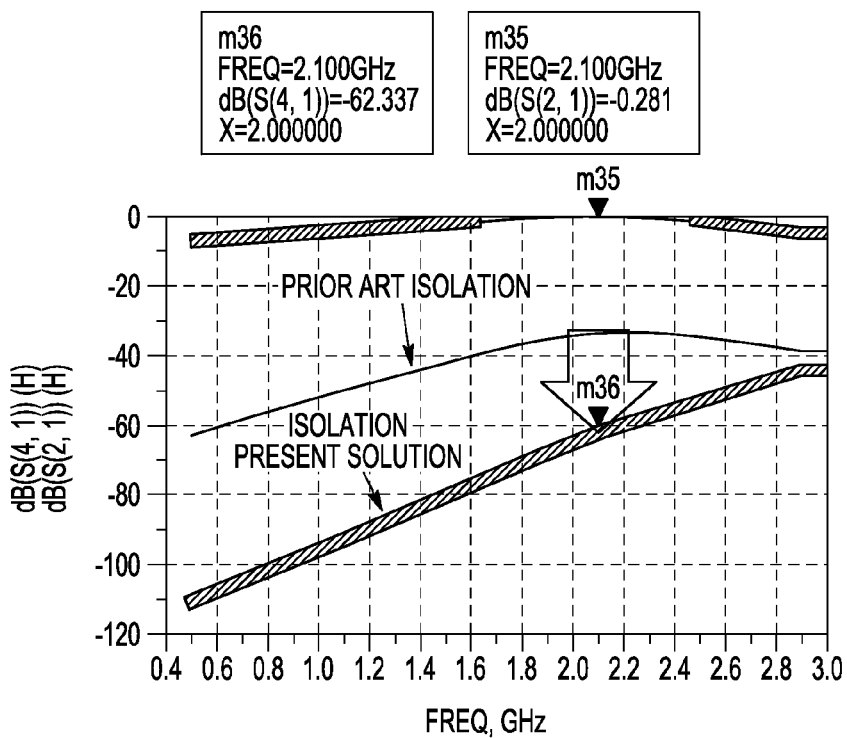
FIG. 14 graphically shows a comparison of the isolation obtained with the electromagnetic simulations shown in FIGS. 13a and 13b.
Figure 15:
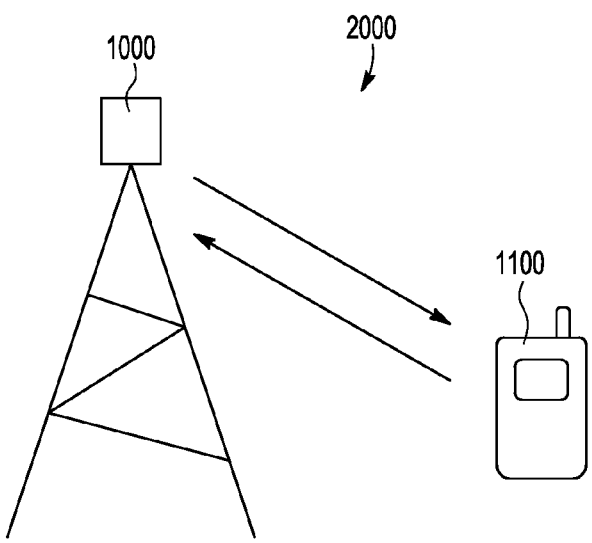
FIG. 15 schematically shows a mobile communications system.

Any of the above described power amplifier modules/ power amplifier integrated circuit modules/packages/may be embedded in a printed circuit board and may be embedded with or without the printed circuit board in a base station 1000 as in the example shown in FIG. 14 used in a mobile communications system 2000 which provides the down-link transmission of the RF signal to mobile devices 1100 such as for example mobile phones.

In the foregoing specification, the invention has been described with reference to specific examples of embodiments of the invention. It will, however, be evident that various modifications and changes may be made therein without departing from the broader scope of the invention as set forth in the appended claims and that the claims should not be construed as limited to the examples. For example, the connections between electrically coupled devices may be any type of connection suitable to transfer signals from or to the respective nodes, units or devices, for example via intermediate devices. Accordingly, unless implied or stated otherwise the connections may for example be direct connections or indirect connections.

Likewise, bondwires can be replaced by electrically conductive elements, e.g., microstrip lines on top of plastic substrate, conductive lines on top of a ceramic substrate etc. where suitable.

Any of the above described power amplifier modules/ power amplifier integrated circuit modules or packages may be constructed with multiple active dies, each one of the multiple active dies integrating a different RF power transistor. For example two active dies may be mounted next to each other on the electrically conductive flange 30 on top of the heat sink 150 as shown in FIG. 3 or directly on the heat conducting element 151 (e.g., the heat sink 151) as shown in FIG. 5 or on the electrically isolating but heat conducting element as shown in FIG. 7. The two active dies may integrate two RF power transistors connected for example in a push-pull or Doherty configuration.

Although the invention has been described with respect to specific polarity of potentials, skilled artisans appreciated that polarities of potentials may be reversed.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim comprises the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A radio frequency power amplifier module, comprising:
a die comprising a radio frequency power transistor, the radio frequency power transistor comprising a transistor control terminal, a transistor output terminal and a transistor reference terminal;
a plurality of module terminals at a first side of the die, for electrically connecting the die to an electronic circuit external to the radio frequency power amplifier module, the plurality of module terminals comprising: a module input terminal electrically coupled to the transistor control terminal, a module output terminal electrically coupled to the transistor output terminal and at least two module reference terminals being electrically coupled to the transistor reference terminal, the module input terminal and one of the at least two module reference terminals being located at a first lateral side of the first side of the die, and the module output terminal and another one of the at least two module reference terminals being located at a second lateral side of the first side of the die opposite to the first lateral side,
an electrically isolating layer and a heat conducting element, both being arranged at a second side of the die opposite to the first side, the heat conducting element having a die-facing surface which is physically separated and electrically isolated from the die by the electrically isolating layer, the die being in thermal contact with the heat conducting element via the electrically isolating layer for transferring heat generated during operation of the power amplifier transistor away from the die to the heat conducting element, the electrically isolating layer being in direct contact with the second side of the die, and the electrically isolating layer holding the die relative to the heat conducting element.

2. A radio frequency power amplifier module according to claim 1, wherein the die further comprises a conductive layer electrically connected to the transistor reference terminal and thermally coupled to the heat conducting element through the electrically isolating layer.

3. A radio frequency power amplifier module according to claim 2, wherein the conductive layer comprises a patterned metal layer directly adjacent to the electrically isolating layer.

4. A radio frequency power amplifier module according to claim 2 wherein the conductive layer comprises:
a blanket metal layer directly adjacent to the electrically isolating layer, and
a metal strip layer arranged at a surface on the first side of the die, the metal strip layer being electrically connected to the blanket metal layer.

5. A radio frequency power amplifier module according to claim 1, wherein the at least two module reference terminals are electrically isolated from the heat conducting element.

6. A radio frequency power amplifier module according to claim 5, wherein the heat conducting element is made of an electrically isolating material.

7. A radio frequency power amplifier module according to claim 1, wherein the heat conducting element is made of electrically conductive material and the at least two module reference terminals are electrically connected to the heat conducting element.

8. A radio frequency power amplifier module according to claim 1, wherein the module input terminal, the module output terminal and the at least two module reference terminals are electrically coupled to the control terminal, to the transistor output terminal and to the transistor reference terminal via a single input conductive element, a single output conductive element, and at least two reference conductive elements, respectively.

9. A radio frequency power amplifier module according to claim 8, wherein the single input conductive element is arranged adjacent to and in parallel with one of the at least two reference conductive elements and wherein the single output conductive element is arranged adjacent to and in a parallel with another one of the at least two reference conductive elements.

10. A radio frequency power amplifier module according to claim 1, wherein the module input terminal, the module output terminal and the at least two module reference terminals are electrically coupled to the control terminal, to the transistor output terminal and to the transistor reference terminal via an input array of parallel arranged input conductive elements, an output array of parallel arranged output conductive elements, and at least two reference arrays of parallel mutually arranged reference conductive elements, respectively.

11. A radio frequency power amplifier module according to claim 1, wherein the radio frequency power transistor is arranged to operate in a radio frequency range and in a range of output power between 100 to 400 watts.

12. A printed circuit board, PCB, comprising the radio frequency power amplifier module as claimed in claim 1, and wherein the heat conducting element comprises a heat sink attached to the PCB and wherein the module input terminal, the module output terminal and the at least two module reference terminals are electrically coupled to the heat sink.

13. A radio frequency power amplifier package, comprising:
the radio frequency power amplifier module as claimed in claim 1,
wherein the heat conducting element is a flange and the module input terminal, the module output terminal and the at least two module reference terminals are an input lead, an output lead and a reference lead of the radio frequency power amplifier package, respectively;
the package further comprising a window frame protruding from the die facing surface of the flange, the window frame defining respective lateral sides of the package and at least partially enclosing the die, and wherein said leads are situated on said window frame and protrude, in a longitudinal direction parallel to the die facing surface, from at least one of the lateral sides outwards.

14. A base station for mobile communications, comprising: the radio frequency power amplifier module as claimed in claim 1.

15. A radio frequency power amplifier module comprising:
a die comprising a radio frequency power transistor, the radio frequency power transistor comprising a transistor control terminal, a transistor output terminal and a transistor reference terminal;
a plurality of module terminals at a first side of the die, for electrically connecting the die to an electronic circuit external to the radio frequency power amplifier module, the plurality of module terminals comprising: a module input terminal electrically coupled to the transistor control terminal, a module output terminal electrically coupled to the transistor output terminal and at least two module reference terminals being electrically coupled to the transistor reference terminal, the module input terminal and one of the at least two module reference terminals being located at a first lateral side of the first side of the die, and the module output terminal and another one of the at least two module reference terminals being located at a second lateral side of the first side of the die opposite to the first lateral side; and
an electrically isolating layer and a heat conducting element, both being arranged at a second side of the die opposite to the first side, the heat conducting element having a die-facing surface which is physically separated and electrically isolated from the die by the electrically isolating layer, the die being in thermal contact with the heat conducting element via the electrically isolating layer for transferring heat generated during operation of the power amplifier transistor away from the die to the heat conducting element, and the electrically isolating layer holding the die relative to the heat conducting element, wherein the heat conducting element is made of electrically conductive material and the at least two module reference terminals are electrically connected to the heat conducting element, and wherein the at least two module reference terminals are electrically connected to the heat conducting element via conductive vias through a dielectric material arranged at the first lateral side for electrically isolating the module input terminal from the heat conducting element, and at the second lateral side for isolating the module output terminal from the heat conducting element, respectively, a first one of the conductive vias being arranged at the first lateral side for electrically connecting the respective module reference terminal to the heat conducting element and a second one of the conductive vias being arranged at the second lateral side for electrically connecting the respective module reference terminal to the heat conducting element.

16. A radio frequency power amplifier module comprising:
a die comprising a radio frequency power transistor, the radio frequency power transistor comprising a transistor control terminal, a transistor output terminal and a transistor reference terminal;
a plurality of module terminals at a first side of the die, for electrically connecting the die to an electronic circuit external to the radio frequency power amplifier module, the plurality of module terminals comprising: a module input terminal electrically coupled to the transistor control terminal, a module output terminal electrically coupled to the transistor output terminal and at least two module reference terminals being electrically coupled to the transistor reference terminal, the module input terminal and one of the at least two module reference terminals being located at a first lateral side of the first side of the die, and the module output terminal and another one of the at least two module reference terminals being located at a second lateral side of the first side of the die opposite to the first lateral side; and
an electrically isolating layer and a heat conducting element, both being arranged at a second side of the die opposite to the first side, the heat conducting element having a die-facing surface which is physically separated and electrically isolated from the die by the electrically isolating layer, the die being in thermal contact with the heat conducting element via the electrically isolating layer for transferring heat generated during operation of the power amplifier transistor away from the die to the heat conducting element, and the electrically isolating layer holding the die relative to the heat conducting element,
wherein the module input terminal, the module output terminal and the at least two module reference terminals are electrically coupled to the control terminal, to the transistor output terminal and to the transistor reference terminal via an input array of parallel arranged input conductive elements, an output array of parallel arranged output conductive elements, and at least two reference arrays of parallel mutually arranged reference conductive elements, respectively, and wherein:
the input conductive elements of the input array are connected to one or more input contacts located on a first surface of the die at the first side,
the output conductive elements of the output array are connected to one or more output contacts located on the first surface, and
the reference conductive elements of the at least two reference arrays are connected to one or more reference contacts located on the first surface of the die at the first side.

17. A radio frequency power amplifier module as claimed in claim 16, wherein:
the reference conductive elements of a first one of the at least two reference arrays are arranged in parallel with the input conductive elements of the input array and wherein two consecutive reference conductive elements of the first reference array are separated by the input conductive elements of the input array, and
the reference conductive elements of a second one of the at least two reference arrays are arranged in parallel with the output conductive elements of the output array and wherein two consecutive reference conductive elements of the second reference array are separated by the output conductive elements of the output array.

18. A radio frequency power amplifier module comprising:
a die comprising a radio frequency power transistor, the radio frequency power transistor comprising a transistor control terminal, a transistor output terminal and a transistor reference terminal;
a plurality of module terminals at a first side of the die, for electrically connecting the die to an electronic circuit external to the radio frequency power amplifier module, the plurality of module terminals comprising: a module input terminal electrically coupled to the transistor control terminal, a module output terminal electrically coupled to the transistor output terminal and at least two module reference terminals being electrically coupled to the transistor reference terminal, the module input terminal and one of the at least two module reference terminals being located at a first lateral side of the first side of the die, and the module output terminal and another one of the at least two module reference terminals being located at a second lateral side of the first side of the die opposite to the first lateral side, an electrically isolating layer and a heat conducting element, both being arranged at a second side of the die opposite to the first side, the heat conducting element having a die-facing surface which is physically separated and electrically isolated from the die by the electrically isolating layer, the die being in thermal contact with the heat conducting element via the electrically isolating layer for transferring heat generated during operation of the power amplifier transistor away from the die to the heat conducting element, and the electrically isolating layer holding the die relative to the heat conducting element, wherein the module input terminal, the module output terminal and the at least two module reference terminals are electrically coupled to the control terminal, to the transistor output terminal and to the transistor reference terminal via an input array of parallel arranged input conductive elements, an output array of parallel arranged output conductive elements, and at least two reference arrays of parallel mutually arranged reference conductive elements, respectively, and wherein the conductive elements of a first reference array at the first lateral side are interdigitated in a parallel arrangement with the conductive elements of the input array, and wherein the conductive elements of a second reference array at the second lateral side are interdigitated in a parallel arrangement with the output conductive elements of the output array.

19. A radio frequency power amplifier integrated circuit module, comprising:
  a radio frequency power amplifier module comprising:
    a die comprising a radio frequency power transistor, the radio frequency power transistor comprising a transistor control terminal, a transistor output terminal and a transistor reference terminal;
    a plurality of module terminals at a first side of the die, for electrically connecting the die to an electronic circuit external to the radio frequency power amplifier module, the plurality of module terminals comprising: a module input terminal electrically coupled to the transistor control terminal, a module output terminal electrically coupled to the transistor output terminal and at least two module reference terminals being electrically coupled to the transistor reference terminal, the module input terminal and one of the at least two module reference terminals being located at a first lateral side of the first side of the die, and the module output terminal and another one of the at least two module reference terminals being located at a second lateral side of the first side of the die opposite to the first lateral side; and
    an electrically isolating layer and a heat conducting element, both being arranged at a second side of the die opposite to the first side, the heat conducting element having a die-facing surface which is physically separated and electrically isolated from the die by the electrically isolating layer, the die being in thermal contact with the heat conducting element via the electrically isolating layer for transferring heat generated during operation of the power amplifier transistor away from the die to the heat conducting element, and the electrically isolating layer holding the die relative to the heat conducting element;
  a shunt capacitor comprising:
    a first capacitor plate integrated in the die, the first capacitor plate being electrically connected to the control terminal or to the transistor output terminal,
    a second capacitor plate formed by an area of the heat conducting element overlapping the first plate, the second capacitor plate being electrically connected to the module reference terminal via the heat conducting element, and
    a dielectric layer formed by an area of said isolating layer between the first capacitor plate and the second capacitor plate; and
  a radio frequency capacitor, a first terminal of the radio frequency capacitor being electrically coupled to the control terminal or to the transistor output terminal and a second terminal of the radio frequency capacitor being electrically coupled to the transistor reference terminal.

* * * * *